US007560322B2

(12) United States Patent
Clarke et al.

(10) Patent No.: US 7,560,322 B2
(45) Date of Patent: Jul. 14, 2009

(54) METHOD OF MAKING A SEMICONDUCTOR STRUCTURE FOR HIGH POWER SEMICONDUCTOR DEVICES

(75) Inventors: Rowland C. Clarke, Sykesville, MD (US); Robert S. Howell, Silver Spring, MD (US); Michael E. Aumer, Laurel, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 11/248,195

(22) Filed: Oct. 13, 2005

(65) Prior Publication Data

US 2006/0088978 A1    Apr. 27, 2006

Related U.S. Application Data

(60) Provisional application No. 60/622,201, filed on Oct. 27, 2004.

(51) Int. Cl.
*H01L 21/338* (2006.01)
*H01L 21/30* (2006.01)
(52) U.S. Cl. .................... 438/167; 438/172; 438/455; 438/459; 257/E29.241; 257/E29.267; 257/E21.054; 257/E21.403
(58) Field of Classification Search ............. 438/459, 438/107, 167, 172, 455; 257/E29.252, E29.241, 257/E29.267, E21.054, E21.403
See application file for complete search history.

(56) References Cited

U.S. PATENT DOCUMENTS 5,441,911 A    8/1995   Malhi 5,476,819 A * 12/1995   Warren ...................... 438/456
6,057,212 A *  5/2000   Chan et al. ................. 438/455
6,328,796 B1 * 12/2001   Kub et al. .................... 117/94

(Continued)

FOREIGN PATENT DOCUMENTS

WO    WO-03/036699 A2    5/2003
WO    WO 03/036699 A2 *  5/2003

OTHER PUBLICATIONS

Inoue et al., "Characteristics of New Dielectric Isolation Wafers for High Voltage Power IC's by Single-Si poly-Si Direct Bonding (SPSDB) Technique", IEEE Transactions on Electron Devices, vol. 42, No. 2, Feb. 1995.*

(Continued)

*Primary Examiner*—Hsien-ming Lee
(74) *Attorney, Agent, or Firm*—Andrews Kurth LLP

(57) ABSTRACT

A substrate arrangement for high power semiconductor devices includes a SiC wafer having a Si layer deposited on a surface of the SiC wafer. An SOI structure having a first layer of Si, an intermediate layer of $SiO_2$ and a third layer of Si, has its third layer of Si bonded to the Si deposited on the SiC wafer, forming a unitary structure. The first layer of Si and the intermediate layer of $SiO_2$ of the SOI are removed, leaving a pure third layer of Si on which various semiconductor devices may be fabricated. The third layer of Si and deposited Si layer may be removed over a portion of the substrate arrangement such that one or more semiconductor devices may be fabricated on the SiC wafer while other semiconductor devices may be accommodated on the pure third layer of Si.

8 Claims, 3 Drawing Sheets

U.S. PATENT DOCUMENTS

| | | | |
|---|---|---|---|
| 6,388,290 B1 * | 5/2002 | Celler et al. | 257/350 |
| 6,936,482 B2 * | 8/2005 | Auberton-Herve | 438/14 |
| 7,172,911 B2 * | 2/2007 | Kalvesten et al. | 438/29 |
| 2003/0151051 A1 * | 8/2003 | Johnson et al. | 257/77 |
| 2003/0211706 A1 * | 11/2003 | Kurtz et al. | 438/458 |
| 2007/0072391 A1 * | 3/2007 | Pocas et al. | 438/455 |

OTHER PUBLICATIONS

Shenoy et al., "High-Voltage Double-Implanted Power MOSFET's in 6H-SiC", IEEE Electron Device Letters, vol. 18, No. 3, Mar. 1997.*

* cited by examiner

METHOD OF MAKING A SEMICONDUCTOR STRUCTURE FOR HIGH POWER SEMICONDUCTOR DEVICES

CROSS-REFERENCE TO RELATED APPLICATIONS

The present application claims the benefit of priority of U.S. provisional patent application Ser. No. 60/622,201 filed on Oct. 27, 2004, which is hereby expressly incorporated by reference.

BACKGROUND OF THE INVENTION

1. Field of the Invention

The invention in general relates to semiconductor structures and more particularly to a substrate arrangement for high power semiconductor devices.

2. Description of Related Art

Semiconductor devices made from, for example, Si (silicon) and GaN (gallium nitride) are fabricated on a substrate. Various such devices are high power devices operating at extremely high power densities. Examples of such high power devices include power switches, amplifiers, GaN based microwave integrated circuits and lasers, to name a few. These devices require a low thermal resistance channel to dissipate the heat generated by them.

It is a primary object of the present invention to provide a substrate arrangement which adequately provides high thermal conductivity to remove the heat generated by high power semiconductor devices.

SUMMARY OF THE INVENTION

A method of making a semiconductor structure includes the steps of providing a silicon carbide wafer and depositing a silicon layer on a surface of the wafer. A silicon on insulator structure having a first layer of silicon, an intermediate layer of an oxide of silicon and a third layer of silicon has its third layer of silicon bonded to the deposited layer of silicon which is on the surface of the wafer. The first layer of silicon is removed from the silicon on insulator structure and then the intermediate layer of an oxide of silicon is removed to expose the third layer of silicon. At least one semiconductor device is fabricated on the exposed third layer of silicon.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1A:
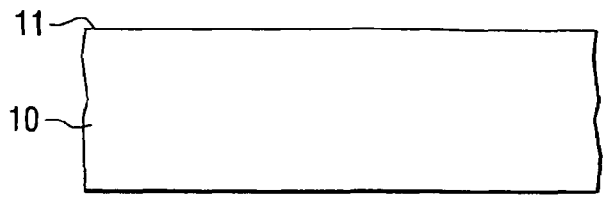
FIGS. 1A to 1E illustrate the fabrication of the substrate.

In FIG. 1A, wafer 10, having a surface 11, is a SiC (silicon carbide) wafer utilized herein for its high thermal conductivity properties. SiC wafer 10 exhibits extreme thermal stability which promises long term reliable operation at high temperatures. SiC wafer 10 may be of the readily available 4H or 6H polytype or, depending on the subsequent semiconductor devices to be applied, a poly 3-C SiC (polycrystalline cubic SiC) may also be used. This latter material has the advantage of being less costly than the 4H and 6H polytypes, and is fabricated and available in larger diameter sizes.

Figure 1B:
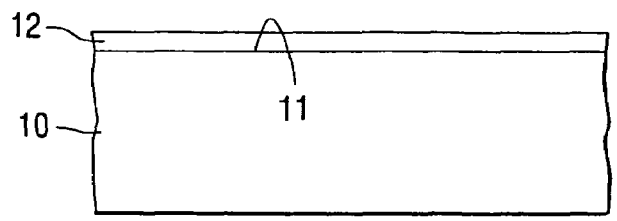

The next step in the fabrication process, as indicated in FIG. 1B, deposits a Si layer 12 on the surface 11 of wafer 10. The Si layer 12 is either an α-Si (amorphous Si), deposited, for example, by sputtering, or a poly-Si (polysilicon) deposited, for example by chemical vapor deposition.

Figure 1C:
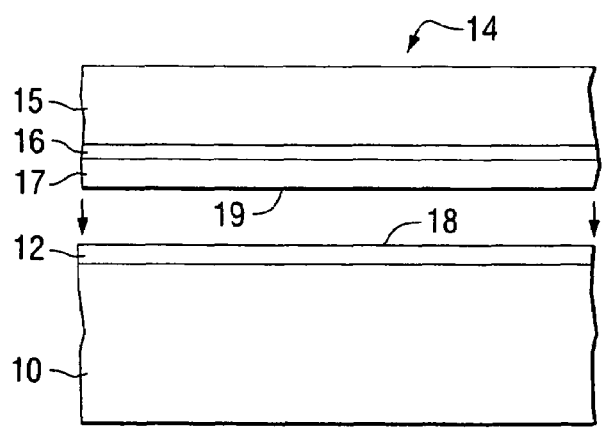

In FIG. 1C, an SOI (Si on insulator) structure 14, comprised of a first layer 15 of Si, an intermediate layer 16 of $SiO_2$ (Si dioxide) and a third layer 17 also of Si, is brought into contact with the wafer 10 and is bonded to it, via Si layer 12. The bonding is effected by initially polishing surfaces 18 and 19, of Si layers 12 and 17 respectively, such that the roughness of the two surfaces 18 and 19 is less than around 10 nm (nanometers). These surfaces are then brought into contact with one another and pressure is applied to bond the two structures together. The bonded arrangement may then be annealed at around 500° to 1100° C. (centigrade) to increase the bond strength.

Figure 1D:
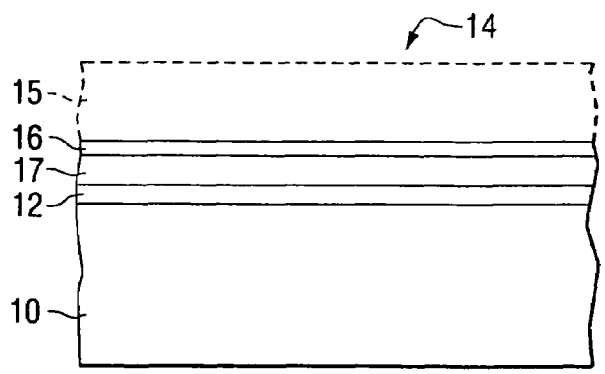
Figure 1E:
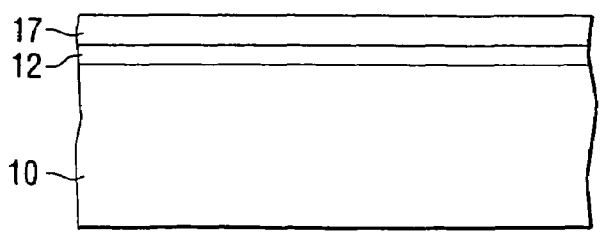

The process continues with the removal of the first layer 15 of Si from the SOI structure 14, as in FIG. 1D. This removal may be by an initial mechanical removal, such as by grinding to remove the major bulk of the Si layer 15, followed by a plasma etch down to the $SiO_2$ layer 18 to remove the remaining Si. The $SiO_2$ layer 16 is next removed such as with hydrogen fluoride or hydrofluoric acid, as depicted in FIG. 1E, leaving a substrate 20 with a SiC base 10 and a single crystal Si surface layer 17 upon which various semiconductor devices may be fabricated by techniques well known to those skilled in the art. An example of one such semiconductor device is illustrated in FIG. 2.

Figure 2:
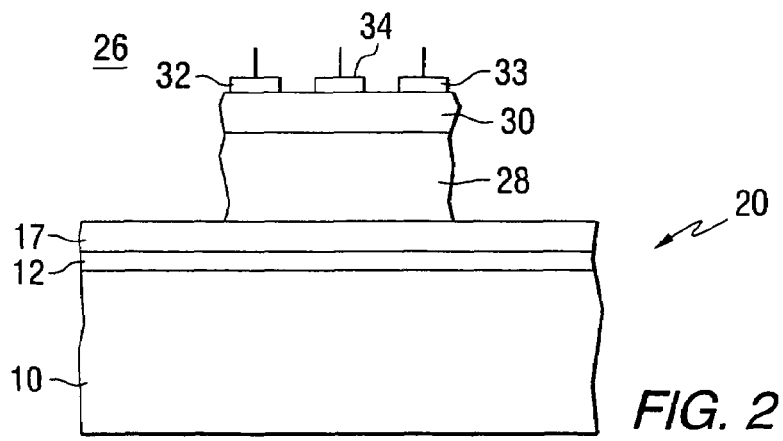
FIGS. 2 to 5 illustrate various semiconductor devices formed on the substrate.

FIG. 2 illustrates a HEMT (high electron mobility transistor) device 26 which is GaN-based. The transistor 26 includes a layer 28 of GaN deposited on the single crystal layer 17 of Si which is suitable for GaN deposition. A layer 30 of AlGaN (aluminum GaN) is deposited on GaN layer 28 and is provided with a series of contacts. More particularly, contacts 32 and 33 which may be of a titanium-aluminum composition, forms the respective source and drain of the HEMT 26, while contact 34, which may be of a nickel-gold composition, forms a Schottky gate contact.

Figure 3:
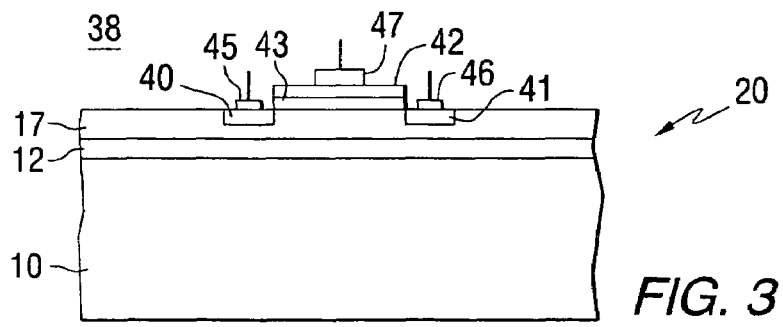

In FIG. 3, a MOS (metal oxide semiconductor) transistor 38 is formed on the substrate 20. MOS transistor 38 includes source and drain regions 40 and 41 diffused or ion implanted into the single crystal Si layer 17. A transistor gate 42 is applied over a deposited thin oxide layer 43 and ohmic contacts 43, 44 and 45 are applied to the respective source, drain and gate regions.

Figure 4:
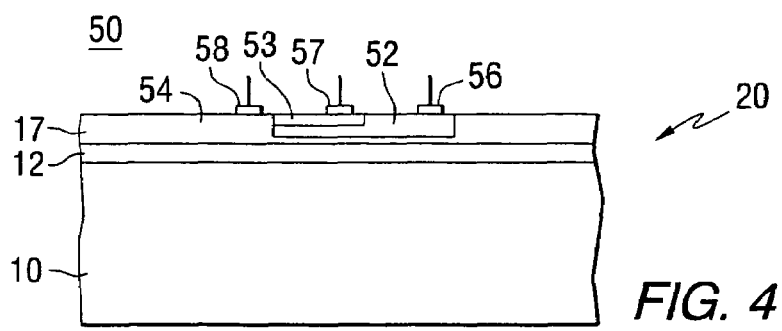

A bipolar transistor 50 is illustrated in FIG. 4. The bipolar transistor 50 includes a collector region 52 in Si layer 17 and a base region 53 within the collector region 52. The region of Si layer 17 adjacent the collector and base 52 and 53 forms the emitter portion of the transistor. Ohmic contacts 56, 57 and 58 are respectively applied to the collector, base and emitter 52, 53 and 54.

Figure 5:
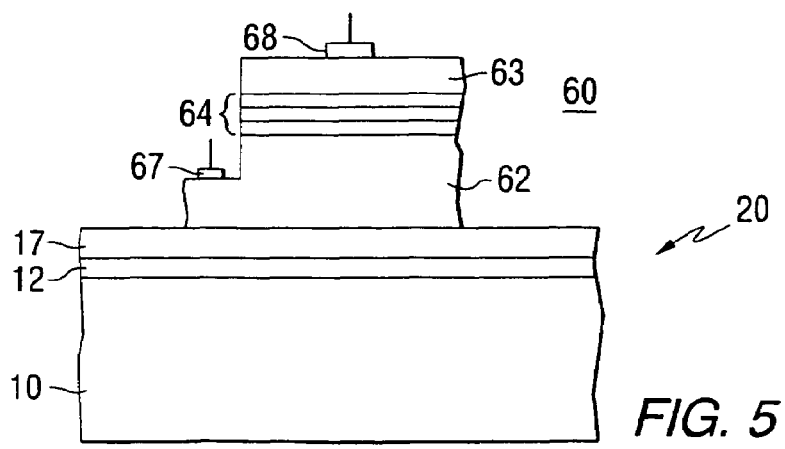

The substrate 20 may also accommodate semiconductor optical devices as depicted in FIG. 5. FIG. 5 illustrates a GaN-based light emitting device 60 which includes an n-type GaN layer 62, a p-type GaN layer 63 and a multiple quantum well 64 interposed between them. Ohmic contacts 67 and 68 are placed on the n-type GaN layer 62 and p-type GaN layer 63 respectively.

Very basically, if a given semiconductor material with a small energy gap such as InGaN (indium GaN) is sandwiched between energy barriers from a semiconductor material with a larger energy gap such as GaN, a quantum well is formed between the barriers. If the multiple quantum well arrangement is sandwiched between n-type and p-type semiconductors, such as layers 62 and 63, to which an electric voltage is applied, holes from the p-type semiconductor material combine with electrons from the n-type semiconductor material resulting in the release of photons of a particular wavelength, depending upon the composition and width of the multiple quantum well 64. For GaN based materials, the wavelength is in the UV or visible region. When a voltage is applied across the contacts 67 and 68, UV light is generated and projects primarily out the top surface of the device.

Figure 6A:
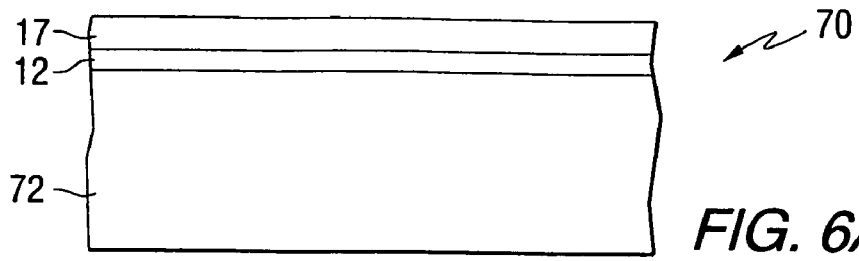
FIGS. 6A to 6C illustrate an alternative fabrication process.
Figure 6B:
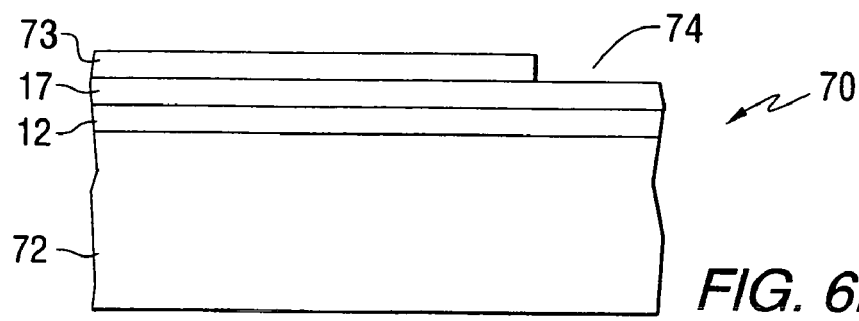
Figure 6C:
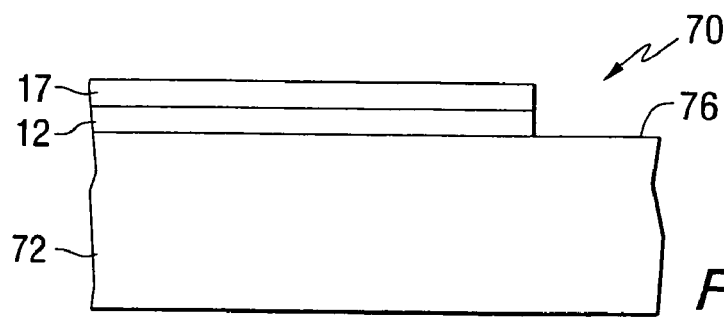

For the devices of FIGS. 2, 3, 4 and 5, the wafer 10 may be of the less expensive poly 3-C SiC variety, and multiple compatible semiconductor devices may be made on the same substrate 20. For some applications it may be desirable to combine a high power SiC based device with a Si based device on the same substrate. FIGS. 6A to 6C illustrate a process for forming a substrate to achieve this objective.

In FIG. 6A, wafer 70 is formed in the same manner as wafer 20 of FIG. 1E, except that the base wafer 72 is, preferably, of a pure crystalline SiC such as a 4H or 6H polytype. In FIG. 6B a portion of the surface of wafer 70 is covered with a masking material 73, leaving an exposed region 74. The exposed portions of layers 12 and 17 in this region 74 are removed, such as by etching, leaving a surface 76 of single crystal SiC (or cubic 3-C, if used), as indicated in FIG. 6C.

Figure 7:
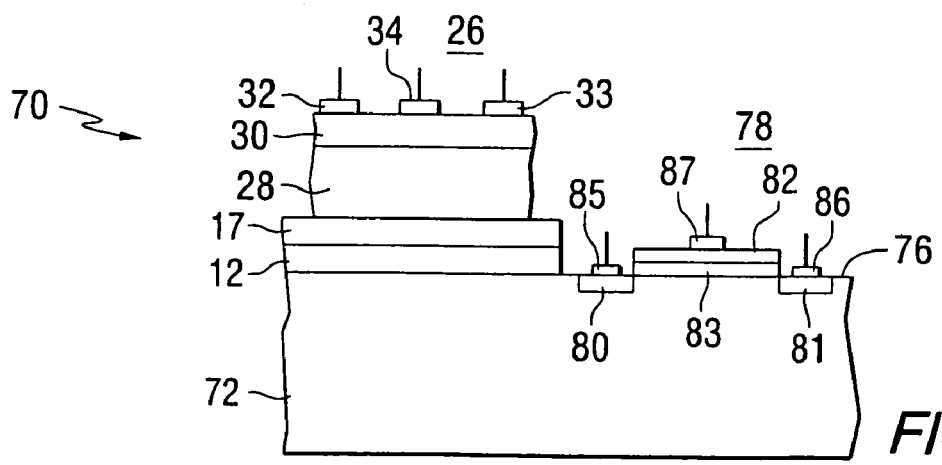
FIG. 7 illustrates semiconductor devices formed on the alternate fabricated substrate.

In FIG. 7, a MOS transistor 78 is formed on exposed surface 76 of the substrate 70. MOS transistor 78 includes source and drain regions 80 and 81 diffused or ion implanted into the single crystal SiC wafer 72. A transistor gate 82 is applied over a deposited thin oxide layer 83 and ohmic contacts 85, 86 and 87 are applied to the respective source, drain and gate regions.

FIG. 7 also illustrates another semiconductor device fabricated on the substrate 70. The other semiconductor device is illustrated, by way of example, as the HEMT device of FIG. 3, formed on the Si layer 17, as opposed to the SiC which accommodates the MOS transistor 78. Thus, both SiC and Si based semiconductor devices may be made on the same substrate, with the use of a pure crystalline SiC wafer.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method of making a semiconductor structure, comprising the steps of:
   providing a silicon carbide wafer; depositing a silicon layer on a surface of said wafer;
   providing a silicon on insulator structure having a first layer of silicon, an intermediate layer of an oxide of silicon and a third layer of silicon;
   bonding said third layer of silicon to said deposited silicon layer which is on said surface of said wafer, wherein the step of bonding comprises:
      polishing said third layer of silicon and polishing said deposited silicon layer which is on said surface of said wafer to a surface roughness of less than around 10 nm, and
      bringing said polished surfaces of said third layer of silicon and said deposited silicon layer together and applying pressure;
   removing said first layer of silicon from said silicon on insulator structure;
   removing said intermediate layer of an oxide of silicon from said silicon on insulator structure to expose said third layer of silicon; and
   fabricating at least one semiconductor device on said exposed third layer of silicon.

2. A method according to claim 1 which includes the step of: selecting said silicon carbide wafer from the group consisting of polycrystalline cubic silicon carbide and 4H and 6H polytypes.

3. A method according to claim 1 which includes the step of: selecting said deposited silicon layer from the group consisting of amorphous silicon and polysilicon.

4. A method according to claim 1 which includes the additional step of:
   annealing the resulting structure at around 500 to 1100° C.

5. A method according to claim 1 which includes the steps of:
   after said third layer of silicon is exposed, depositing a masking material on a portion of said exposed third layer of silicon, leaving an unexposed region of said third layer of silicon;
   removing said third layer of silicon and the underlying deposited silicon layer in said unexposed region, to expose a surface of said silicon carbide wafer;
   removing said masking material;
   fabricating at least one semiconductor device on said exposed silicon carbide wafer surface; and
   fabricating at least one semiconductor device on said exposed third layer of silicon.

6. A method according to claim 5 which includes the steps of: providing a pure single crystal silicon carbide wafer.

7. A method according to claim 6 which includes the steps of: providing a pure single crystal silicon carbide wafer selected from the group consisting of 4H and 6H polytypes.

8. A method of making a semiconductor structure, comprising the steps of:
   providing a silicon carbide wafer; depositing a silicon layer on a surface of said wafer;
   providing a silicon on insulator structure having a first layer of silicon, an intermediate layer of an oxide of silicon and a third layer of silicon;
   bonding said third layer of silicon to said deposited silicon layer which is on said surface of said wafer;
   removing said first layer of silicon; from said silicon on insulator structure;
   removing said intermediate layer of an oxide of silicon from said silicon on insulator structure to expose said third layer of silicon;
   fabricating at least one semiconductor device on said exposed third layer of silicon;

after said third layer of silicon is exposed, depositing a masking material on a portion of said exposed third layer of silicon, leaving an unexposed region of said third layer of silicon;

removing said third layer of silicon and the underlying deposited silicon layer in said unexposed region, to expose a surface of said silicon carbide wafer;

removing said masking material;

fabricating at least one semiconductor device on said exposed silicon carbide wafer surface; and fabricating at least one semiconductor device on said exposed third layer of silicon.

* * * * *